United States Patent [19]

Sadigh-Behzadi

[11] Patent Number: 4,744,143

[45] Date of Patent: May 17, 1988

[54] COVERING FOR AN ELECTRICAL CONNECTOR

[75] Inventor: Amir-Akbar Sadigh-Behzadi, Van Nuys, Calif.

[73] Assignee: Thomas & Betts Corporation, Bridgewater, N.J.

[21] Appl. No.: 856,074

[22] Filed: Apr. 25, 1986

[51] Int. Cl.$^{4}$ .......................... H01R 9/09; H05K 3/30

[52] U.S. Cl. ........................................ 29/837; 29/841; 29/876; 439/83; 439/135

[58] Field of Search ....................... 339/36, 38, 17 LC; 29/874, 876, 883, 885, 631, 837, 841; 439/135, 148, 149, 892, 893, 83

[56] References Cited

U.S. PATENT DOCUMENTS

| | | | |
|---|---|---|---|
| 3,375,480 | 3/1968 | Nelson | 439/148 |
| 3,560,632 | 2/1971 | Wallace | 339/36 |
| 3,564,485 | 2/1971 | Cull et al. | 339/36 |
| 4,136,442 | 1/1979 | Harnett | 29/876 |
| 4,408,813 | 10/1983 | Koehler | 439/148 |
| 4,583,807 | 4/1986 | kaufman et al. | 339/17 LC |
| 4,645,278 | 2/1987 | Yevak, Jr. et al. | 29/837 |

*Primary Examiner*—Eugene F. Desmond
*Assistant Examiner*—Paula A. Austin
*Attorney, Agent, or Firm*—Robert M. Rodrick; Salvatore J. Abbruzzese

[57] ABSTRACT

A method and apparatus for sealing exposed portions of an electrical connector is disclosed. A sealing member is formed directly onto the housing of the electrical connector to seal the exposed portions of the electrical contacts therein. The sealing member engages the housing in a non-adhered relation so as to admit removal of the sealing member from the housing. The sealing member is useful to seal the electrical contact from exposure to a protective coating process.

7 Claims, 2 Drawing Sheets

COVERING FOR AN ELECTRICAL CONNECTOR

FIELD OF INVENTION

This invention relates generally to an electrical connector assembly and more particularly to a method and apparatus for sealably covering the exposed electrical terminals of an electrical connector assembly to protect the terminals from exposure to the external environment.

BACKGROUND OF THE INVENTION

The use of printed wiring boards, also known as printed circuit boards, for supporting plural electrical components is wide spread in many electronic fields. These printed circuit boards typically are formed of an insulated substrate having etched conductive traces thereon which serve to interconnect other components both active and passive, which form the electronic circuit assembly. In order to connect one of these printed circuit boards to another or to another external electrical component electrical connectors are typically used. In order to permit the electrical connector to interface with the printed circuit board a header is disposed on the printed circuit board at a selected location and connected by traces to the remainder of the components supported on the board. The header typically includes an insulative housing having plural elongate electrical contacts. One end of the contacts is electrically and mechanically supported to the printed circuit board while the other end of the contacts is exposed for external electrical connection.

It has been noted that often the printed circuit board assembly may be adversely effected by external environmental influences such as dust, dirt or moisture. Therefore, the entire printed circuit board assembly including the header or headers attached thereto is typically subjected to a conformal coating process. This conformal coating, which may be disposed in a number of various manners such as by dipping the printing wiring board in a coating bath or spraying the coating thereover, forms a protective barrier to adverse environmental hazards which may act negatively on the electrical circuitry on the board. This conformal coating is preferably an insulative coating thereby preventing any short circuiting between electrical components supported on the board. One problem that has been noted with the use of conformal coating is that the insulative coating may adhere to electrically conductive areas such as the conductive terminals of the header, which are to remain non-insulated. Thus, before the header can be connected to another electrical connector the conformal coating must be removed from the electrical terminals of the header.

It can be appreciated that it would be advantageous to prevent the conformal coating from covering the terminals of the header during the coating process. However, there is no adequate existing technique to provide a covering for the header contacts while still permitting the conformal coating to cover the remainder of the printed circuit board and components supported thereon. It is desirable to provide a method and apparatus for covering the terminals of the header prior to applying the conformal coating and then being able to remove that covering to expose the electrical contact for exterior electrical connection.

SUMMARY OF THE INVENTION

It is an object of the present invention to provide a method and apparatus for sealing the exposed portions of electrical elements of an insulated electrical connector from external environmental contact.

It is a further object of the present invention to provide a sealing member which is formed directly onto an electrical connector housing which covers portions of the contact elements therein, sealing the elements from external environmental hazards.

It is still a further object of the present invention to provide a sealing member which protects the contacts of an electrical connector during the conformal coating process.

In the efficient attainment of these and other objects the present invention looks toward providing an electrical assembly including an insulative housing having at least one exposed surface. Plural contact elements are supported in the housing, portions of which are exteriorly exposed. A removable sealing member is formed directly on the insulative housing and covers the exposed portion of contact elements thereby sealing those portions from the external environment. The sealing member is formed in a nonadhering relation to the insulative housing to admit ready removal of the sealing material from the housing.

In the method aspect of the present invention, a method of sealing exposed portions of electrical elements of an insulative electrical connector is described. The steps of this method include forming a sealing member directly onto a housing. The sealing member covers the exposed portions of the electrical elements. The sealing member is formed in a nonadhered relationship to the housing to permit easy removal of the sealing member from the housing.

In a more detailed aspect of the present invention, shown by way of preferred embodiment, an electrical connector including electrical terminals therein is disposed on a electrical wiring board. A sealing member is formed directly onto the housing covering the exposed portions of the electrical terminals. This sealing member is nonadheredly attached to the housing. The wiring board and attached electrical connector are subject to a coating process which provides an insulative coating therearound. The sealing member may then be removed from the housing to expose portions of the electrical terminal for exterior electrical connection.

DETAILED DESCRIPTION OF THE PREFERRED EMBODIMENT

Figure 1:
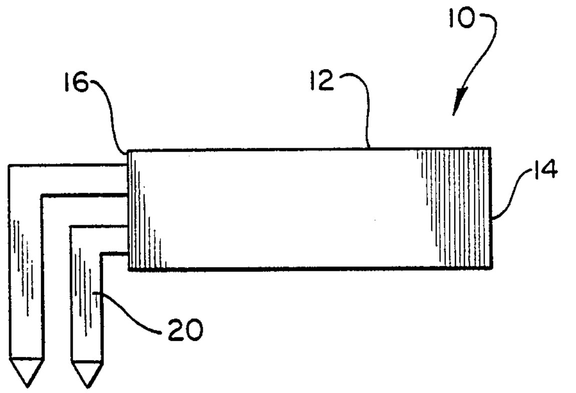
FIGS. 1 and 2 show side and front elevational views respectively of the electrical connector header used in accordance with the present invention.
Figure 2:
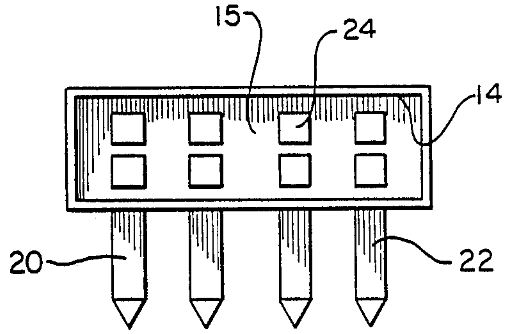
Figure 3:
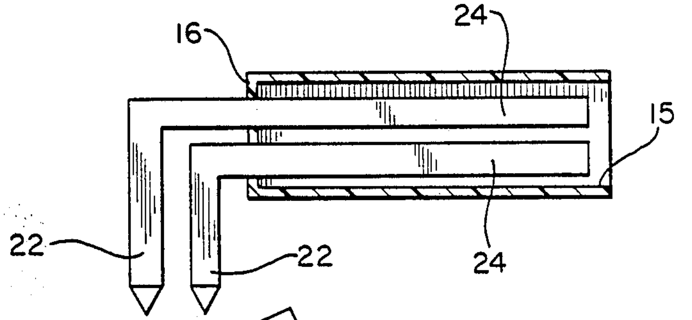
FIG. 3 is a vertical sectional showing of the header connector of FIG. 1.

Referring to FIGS. 1-4, a header 10 which is used in accordance with the present invention is shown.

Header 10 is an elongate electrical connector including an insulative body 12 which is typically formed of a suitable plastic material such as a polyester. In the present illustrative embodiment header 10 is preferably formed of a polyester resin sold by General Electric under the trademark VALOX. Header body 12 is an elongate member having an open front face 14 and a substantially solid back wall 16 including plural openings 18 therethrough. Generally, header 10 has a elongate rectangular shape having a hollow central portion 15 in communication with open face 14.

Header 10 further includes a plurality of spaced electrical contacts 20 supported in and extending through central hollow portion 15 of header body 12. Contacts 20 are pin type electrical contacts each having a first extent 22 which extends exteriorly of body 12 and a second extent 24 which is disposed at a right angle to first extent 32. Extent 24 extends into the hollow central portion 15 of header body 12. Extents 24 are positioned adjacent front face 14 and permit external electrical connection to an electrical connector (not shown). Contacts 20 are positioned in two rows in header 10 with the contact extents 24 extending through openings 18. One row of contacts 20 are shorter than the other row to thus provide for the staggered placement of the contacts in header 10. Header 10 is known in the art as a right angle header. However, straight headers having contacts which are not bent at 90° may also be employed with the present invention. In addition, headers may be employed having more or fewer contacts as is dictated by the particular wiring need.

Figure 4:
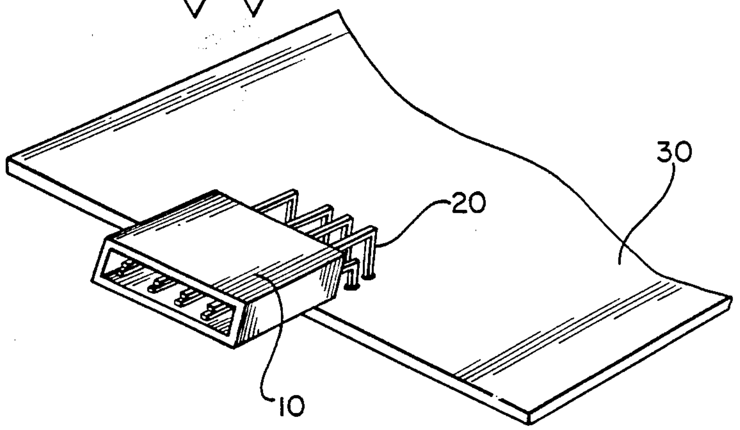
FIG. 4 shows the header of FIG. 1 supported on a printed wiring board.

Referring now to FIG. 4, header 10 is mounted on a printed circuit board 30 with contact extents 22 extending down for connection with the printed circuit board. Contact extents 22 may extend through holes in the printed circuit board and then may be soldered to the board itself. This provides suitable electrical and mechanical connection of the header 10 to the board 30. Circuit board 30 typically includes several other electrical components (not shown) which may be of the active or passive type. These electrical components are mutually interconnected and connected to header 10 by printed traces (also not shown) which are etched onto board 30.

Each of these electrical components including header 10 and the printed circuitry which connects the components together may be typically exposed to external environmental influences. Dust, dirt, moisture or any other contaminant which may be typically found in the areas which the printed circuit board 30 is used may adversely effect the electrical operation of the circuit thereon. Therefore, it has been known that in order to effectively isolate the printed circuit board from these environmental hazards it may be necessary to place a protective coating over the entire board. As is typical in this art, the printed circuit board 30 including header 10 mounted thereon, may be subjected to conformal coating. This coating may be a uniform insulative coating which is placed complecely around the circuit board 30 covering all exposed electrical components as well as the board 30 itself. This conformal coating may be placed on the board in any one of a number of application techniques such as spray coating the board and components or placing the board and components in a coating bath thereby providing a uniform coating therearound. However, as mentioned above, while the coating adequately coats the exposed electrical circuits it may even coat the electrical contacts of the header which should remain exposed for exterior electrical connection.

Figure 5:
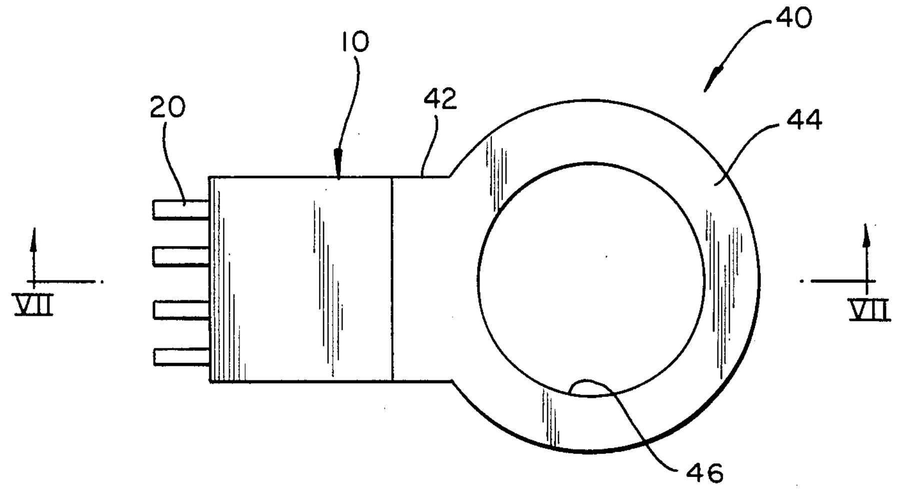
FIGS. 5 and 6 are top plan and side elevational showings respectively, of the header of FIG. 1 including the sealing member of the present invention.
Figure 6:
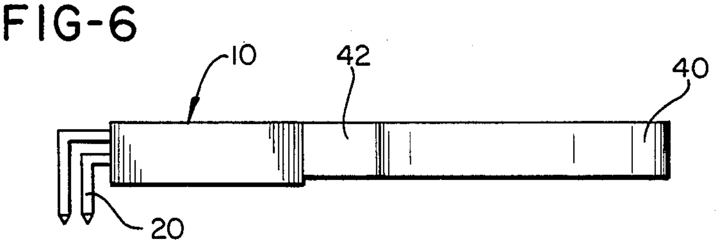
Figure 7:
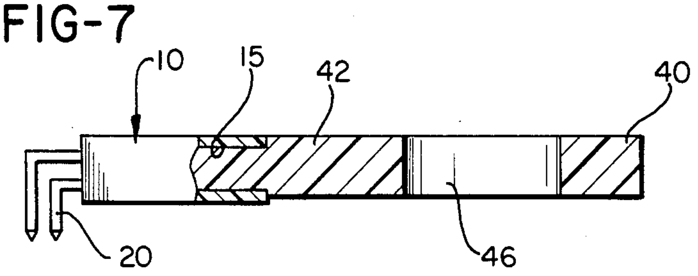
FIG. 7 is a cross-sectional showing of the header and sealing member of FIG. 5 taken along the line VII—VII thereof.

Referring now to FIGS. 5–7, a protective sealing member 40 is shown which is placed adjacent the open end face 14 of header 10 to protect the electrical contacts 20 from being coated during the conformal coating process.

Sealing member 40 is a boot-type member which may be molded, encapsulated or otherwise formed directly on header 10 adjacent the open face 14 thereof. Sealing member 40 is formed of an insulative plastic material which is selected so as to provide a bond to the plastic header 10. As above mentioned, header 10 is formed of a polyester type material such as VALOX. When using a header of this construction a typical plastic selected for sealing member 40 may be polyethylene which may be formed directly onto the VALOX header and yet not adhere thereto. Of course, it is contemplated that other combinations of materials for both the header and the sealing member may be selected. However, these combinations should be such that the sealing member material will not adhere to the header material.

One method of forming the sealing member onto the header may be to injection mold the sealing member directly onto the header adjacent the front face thereof. The form for the mold may be selected to provide a sealing member having a shape such as that shown in FIGS. 5–7. However, it can be appreciated that any other suitable shape may also be provided as long as the entire front face 14 of header 10 including contacts 20 therein are sealed. In typical formation, the header is positioned so that molding material may flow inside hollow central portion 15 of the header 10 surrounding each of the contacts 20. The material may then extend outwardly of the header front face 14 and be formed into the shape shown in FIGS. 5–7. The snape of sealing member 40 is selected such that it has a forward position 42 which is co-extensive with the elongate portion of front face 14 of header 10 to provide a sealed relationship therewith. The rear portion 44 may include an annular ring with a central opening 46 which will facilitate manual removal of the sealing member after the conformal coating process.

Thus, the header 10 may be supplied by the manufacturer with sealing member 40 in place as shown in FIG. 5. Then the header may be assembled onto the printed circuit board as shown in FIG. 4 and placed through the conformal process (not shown) which will coat the entire board, the header and the sealing member 40. Once the coating is placed on the printed circuit board the user may grasp the sealing member by the ring 44 and remove it from the front face 14 of header 10 by manually grasping the ring and pulling it away from the header. As the material selected for the sealing member is such that it will not adheringly engage the header body 12, the sealing member 40 may be easily manually removed. The contacts 20 of header 10 are then exposed for exterior electrical connection.

Various changes to the foregoing described and shown structures would now be evident to those skilled in the art. Accordingly, the particularly disclosed scope of the invention is set forth in the following claims.

I claim:

1. A method of sealing exposed portions of electrical elements of an insulative electrical connector housing from external environmental contact; said method comprising the step of:

forming a sealing member directly onto said housing and said exposed portions, said sealing member being non-adhesively bonded to said housing to admit ready removal of said sealing member from said housing.

2. A method in accordance with claim 1 wherein said housing includes a hollow internal cavity supporting said electrical elements and wherein said forming step includes:

molding said sealing member onto said housing and into said hollow cavity, said sealing member at least partially filling said cavity.

3. A method in accordance with claim 2 wherein said forming step further includes molding said sealing member around each of said exposed portions.

4. A method in accordance with claim 3 wherein said exposed portions are coated with said sealing member.

5. A method of forming an electrical component assembly comprising:

disposing an electrical connector on an electrical wiring board, said electrical connector including an insulative housing having plural electrical terminals, portions of which are exposed from said housing;

forming a sealing member directly onto said housing coating said exposed portions of said electrical terminals, said sealing member being non-adhesively bonded to said housing;

subjecting said wiring board and said electrical connector to a coating of insulative material; and removing said sealing member from said housing to expose said portions of said electrical terminals for exterior electrical connection.

6. A method in accordance with claim 5 wherein said forming step includes:

molding said member onto said housing.

7. A method in accordance with claim 5 wherein said electrical connector housing includes a hollow cavity, said electrical terminals being disposed in said hollow cavity and wherein said forming step includes:

molding said sealing member to fill said cavity and to cover said terminals therein.

* * * * *